United States Patent [19]
Huffman

[11] Patent Number: 4,787,843
[45] Date of Patent: Nov. 29, 1988

[54] PRESSURE BALANCED HEAT PIPE

[75] Inventor: Fred N. Huffman, Sudbury, Mass.

[73] Assignee: Thermo Electron Corporation, Waltham, Mass.

[21] Appl. No.: 65,038

[22] Filed: Jun. 22, 1987

[51] Int. Cl.⁴ .................. F27B 19/02; F28D 15/02
[52] U.S. Cl. .................................. 432/91; 165/32; 165/104.27
[58] Field of Search .............. 165/104.27, 32, 96; 432/90, 91

[56] References Cited

U.S. PATENT DOCUMENTS

| | | | |
|---|---|---|---|
| 3,517,730 | 6/1970 | Wyatt | 165/32 |
| 3,621,906 | 11/1971 | Leffert | 165/32 |
| 3,933,198 | 1/1976 | Hara et al. | 165/32 |
| 3,943,964 | 3/1976 | Asselman et al. | 432/91 |
| 3,947,244 | 3/1976 | Lazaridis | 432/91 |
| 4,073,284 | 2/1978 | Laing | 165/96 |
| 4,387,762 | 6/1983 | Rinderle | 165/104.27 |

FOREIGN PATENT DOCUMENTS 723857 8/1942 Fed. Rep. of Germany ............ 165/104.27
1109574 8/1984 U.S.S.R. ............................. 165/96

Primary Examiner—Albert W. Davis, Jr.
Attorney, Agent, or Firm—Herbert E. Messenger

[57] ABSTRACT

Disclosed is a heat pipe particularly suited for isothermal transfer of heat in high temperature, high pressure operation such as the growing of semiconductor crystals. The heat pipe has a stem communicating with its lower end, a cooler surrounding a portion of the stem, and an expansible bellows connected to the stem. The stem and the expansion chamber formed by the bellows accommodate displaced liquid working fluid to balance pressure within the heat pipe with ambient pressure outside the heat pipe. This avoids the need for complex, multi-layer structures or high strength materials in the heat pipe walls.

10 Claims, 3 Drawing Sheets

PRESSURE BALANCED HEAT PIPE

BACKGROUND OF THE INVENTION

This invention relates in general to heat transfer devices of the type known as heat pipes and more particularly to heat pipes capable of safe and efficient use under extreme operating conditions.

Heat pipes are well known and widely used in applications where it is necessary or desirable to transfer heat from a source to a receiver efficiently and with minimum temperature drop. Generally, the heat pipe is constituted of a vessel or an enclosure of selected shape containing a quantity of working fluid and a wick, usually of capillary material. Heat is applied at the evaporator portion of the vessel to vaporize the working fluid in that vicinity. The vapor is driven to the condenser portion of the vessel where it condenses, giving up heat. Aided by capillary action, the condensate then returns from the condenser portion to the evaporator portion to be vaporized again.

Heat pipes may be formed in practically any configuration and are quite versatile, especially in such applications as where it is desired to transfer heat around bends, over or under obstructions, or to concentrate or diffuse heat from a heat source at a heat receiver.

Situations have arisen, however, where it has been considered unadvisable or even dangerous to utilize heat pipes for heat transfer, even though the uniform temperature distribution and high thermal conductance of heat pipes are qualities of great value in the particular applications. For example, it is sometimes necessary to expose heat pipes to exceptionally high temperature, to high ambient pressure or to both to perform a desired transfer of heat. Other considerations have arisen where there has been reluctance to utilize heat pipes, such as in home appliances where the safety factor looms large or where the cost of materials needed in elements such as large cooking surfaces becomes important.

The present invention will be described in connection with a specific application which is illustrative of those noted above where heat pipes have previously been thought to be impractical or incapable of use.

That application is the growing of crystals of III-V compounds such as gallium arsenide or indium phosphide. These compounds are becoming of increasing importance and are replacing silicon because they are superior to silicon as semiconductors, especially in computer chip applications. Even though the improved performance is widely recognized, use of III-V compounds of the type mentioned has been limited somewhat because of the difficulty of growing these crystals as compared to silicon. Crystals of III-V compounds are grown at temperatures as high as 1600° K. and pressures of the order of 1000 psi. Heat pipes capable of operation at such temperatures and pressures have been thought to be not feasible, either because of the inadequacy of the creep strength of the refractory metals from which such heat pipes are usually made or because of the fragility or expense of known highly specialized materials which have adequate creep strength. For example, tungsten, a material commonly used in high temperature heat pipes, lacks the necessary creep strength for desired thin walls for the extremes of operating conditions involved. On the other hand, silicon carbide, although it may maintain adequate creep strength under extreme conditions, is quite brittle.

One prior art technique employed in an attempt to provide heat pipes for high temperature, high pressure applications is to use chemical vapor deposition to form trilayered walls of silicon carbide-graphite-tungsten. In such structures the silicon carbide provides the necessary load-bearing strength which tungsten lacks at the high temperatures and pressures of operation. Another prior art alternative is the fabrication of heat pipe walls from relatively low strength materials but the incorporation of a large number of internal bridges or braces so that the walls will withstand the pressure of operation. Such structures, however, are exceedingly complex and costly and are not efficient in heat transfer.

SUMMARY OF THE INVENTION

The present invention makes it possible to use in the shell of a heat pipe any of several relatively conventional materials such as molybdenum or niobium and avoids the problems previously considered to be inherent in the use of such materials. Also, a wide range of conventional working fluids may also be employed depending upon the application in which the heat pipe is used. Metals such as sodium, potassium or lithium in a liquid state may be used, and potassium is particularly appropriate for crystal growing because: (1) it is operable as a heat pipe working fluid at temperatures of about 800° K. and above; and (2) it has a vapor pressure at crystal growing temperatures corresponding to the desired inert gas overpressure to suppress vaporization of the melt components.

A heat pipe in accordance with the present invention is preferably formed as a annulus, at least a portion of which provides conditions favorable for the growing of isothermal crystals of III-V compounds The improved uniformity of temperature achieved with the heat pipe should permit the growth of larger crystals with fewer defects. The present invention avoids being limited to fabricating the heat pipe by such prior art methods as chemical vapor depositions of a tri-layer of silicon carbide-graphite-tungsten in which silicon carbide becomes the load bearing member at high temperature. It also avoids the need of building up a heat pipe of low strength materials having undesirably thick walls or numerous internal bridges which degrade the heat pipe action and limit temperature uniformity but which permit the heat pipe to withstand high external pressures. Rather, the present invention contemplates the maintenance of substantially equal pressure internally and externally of the annular heat pipe making feasible the use of low strength materials without compromise of heat pipe function. This objective is achieved by adding to the heat pipe a stem, a cooler, and an expansion chamber. The cooler establishes a temperature gradient down the stem from the operating temperature of the heat pipe at the top of the stem to approximately room temperature at the bottom of the stem. The expansion chamber which communicates with the stem serves to accommodate displaced working fluid and ultimately to balance the pressure inside the heat pipe with ambient pressure outside the heat pipe. This condition may be met by utilizing a working fluid having a vapor pressure equal to or greater than the ambient pressure at the highest contemplated operating temperature of the heat pipe.

For a better understanding of the present invention together with other objects, features and advantages, reference should be made to the following description of a preferred embodiment which should be read with reference to the appended drawings in which:

DESCRIPTION OF PREFERRED EMBODIMENTS

Figure 1:
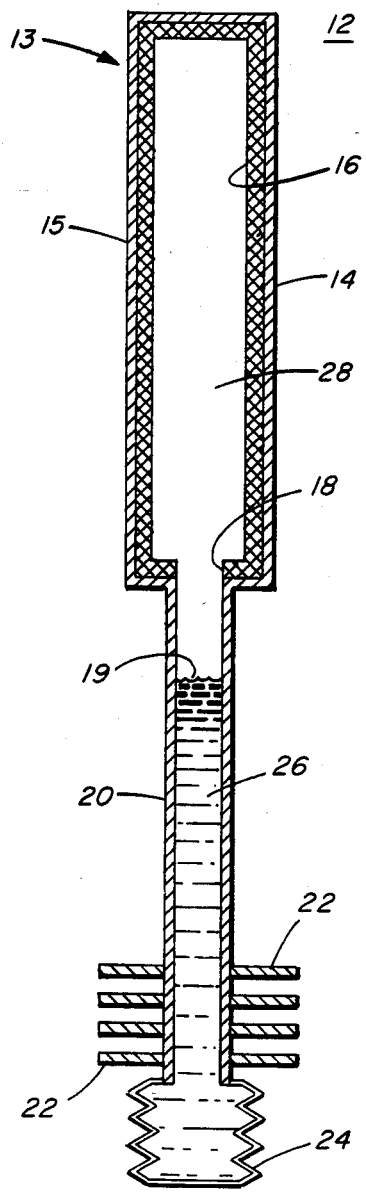
FIG. 1 is somewhat idealized view in section of a heat pipe and appendages made in accordance with the present invention.

FIG. 1 illustrates in idealized fashion a heat pipe 12 which includes an enclosure 13 having an outer wall or evaporator 14 to which heat is applied and an inner wall or condenser 15 across which heat is transferred to work to be heated. Lining the enclosure is a wick 16 which serves as a capillary. The wick 16 may be made of grooves, porous microspheres, or multiple wraps of screen. In order to minimize corrosion, it is usually advantageous to make the wick of the same material as the wall of the enclosure.

The heat pipe of the present invention relies upon neither the trilayering nor the internal bridging technique referred to previously but utilizes any of several relatively inexpensive machinable and weldable high-temperature materials such as molybdenum or niobium to form the walls of the heat pipe shell. That is made possible by maintaining the vapor pressure of the working fluid within the heat pipe equal to or slightly greater than the ambient pressure surrounding the heat pipe at the highest operating temperature of the heat pipe. For example, materials such as lithium, sodium, potassium or rubidium in the liquid state operate satisfactorily as the working fluid for applications such as crystal-growing.

External or ambient pressure may be controlled by enclosing the entire assembly in a suitable compartment. To maintain the desired balance of internal and external pressures, the heat pipe has an opening 18 formed adjacent its lower end through which it communicates with a hollow stem 20. The stem 20 is surrounded adjacent its lower end by cooling fins 22, beneath which the interior of the stem communicates with a bellows 24. The bellows and stem contain a working fluid such as lithium in the liquid state, as indicated by the shading 26, with working fluid in the vapor state filling the remainder of the stem 20 and the interior or vapor space 28 of the enclosure 13.

In FIG. 1, the liquid/vapor interface 19 is shown at a slight distance down the stem 20 for purposes of better illustration. However, under typical storage conditions, as explained in greater detail below, the liquid/vapor interface is approximately at the opening 18 where the stem 20 is joined to the enclosure 13 of the heat pipe. The vapor pressure within the heat pipe is determined by the temperature at the coldest spot of the heat pipe enclosure which contacts the vapor—namely, the liquid/vapor interface. In other words, vapor pressure $P_{HP}$ within the heat pipe corresponds to the saturation pressure at the temperature of the liquid/vapor interface, $T_I$. Thus, heat pipe pressure, $$P_{HP}=f(T_I)$$

The cooling fins 22 adjacent to the bottom of the stem 20 serve to establish a temperature gradient along the stem 20, the temperature at the top being that of the heat pipe adjacent the opening 18 and the temperature at the bottom being approximately that of the surrounding environment. The function of the bellows 24 is to aid in balancing automatically the pressure inside the heat pipe with that outside. As will be noted, the bellows 24 expands and contracts as required to accommodate the working fluid while maintaining the balance of pressure.

Figure 2:
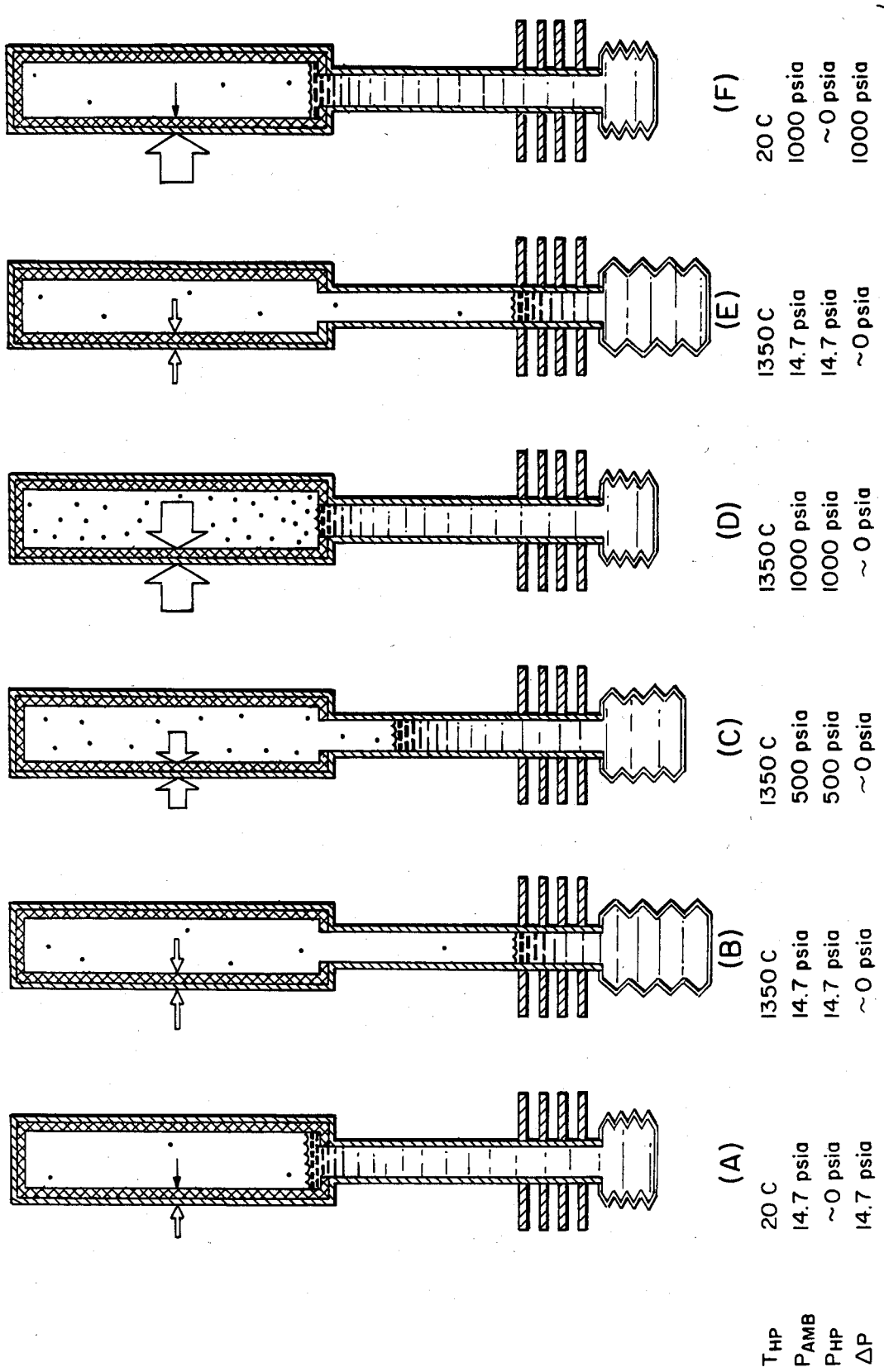
FIG. 2 is a showing of stages of operation of the heat pipe of FIG. 1 in which:
   (A) indicates storage;
   (B) indicates heating;
   (C) indicates pressurization;
   (D) indicates design point operation;
   (E) indicates pressure release; and
   (F) indicates collapse.

FIG. 2 illustrates the states of operation of the pressure-balanced heat pipe of the present invention. Arrows representing internal and ambient pressure about the heat pipe indicate by their size the relative magnitude of those pressures. Stage (A) indicates non-operating or so-called storage conditions. In this instance, the ambient temperature and pressure are more or less standard at 20° C. and 1 atmosphere. Under such circumstances and with the liquid/vapor interface being as shown at the junction of the stem 20 and the heat pipe, the vapor pressure within the heat pipe enclosure is very much less than the 1 atmosphere ambient pressure. Stage (B) indicates the conditions existing as heat is applied to the input portion of the heat pipe 12, raising its temperature to about 1350° C., internal and ambient pressures being about equal to 1 atmosphere. The effect of the application of such heat is to establish a temperature gradient along the stem because of the effect of the cooling mechanism adjacent the bottom of the stem.

The liquid/vapor interface assumes a height at which the temperature $T_I$ is such that the pressure within the heat pipe $P_{HP}$ equals 1 atmosphere. Any further increase in the temperature of the heat pipe will cause the interface to recede down the stem 20 to maintain the condition at which $P_{HP}$ equals 1 atmosphere at all times. The expansion of the bellows under such conditions is indicated in FIG. 2(B). During this stage, however, it should be noted that the apparatus does not operate as a heat pipe.

In Stage (C), after the input portion of the pressure balanced heat pipe has been heated to the desired operating temperature, $T_{OP}$, the ambient pressure, $P_{AMB}$, is increased by external means to a fraction of the operative level (e.g., 500 psia). As the ambient pressure is increased, the bellows compresses and the liquid/vapor interface rises in the stem until $T_I$ reaches a point at which $P_{AMB}=P_{HP}(I_I)$. Regardless of the actual pressure level, the differential pressure $\Delta P = PAMB - PHP \approx O$. There is still no true heat pipe operation at this stage.

At State (D), however, design point operation of the heat pipe is illustrated. The heat pipe temperature $T_{HP}$ remains at about 1350° C. and the ambient pressure $P_{AMB}$ is raised to about 1000 psia. The pressure within the heat pipe still equals the ambient pressure, however, and becomes a function of $T_I$, the temperature of the liquid/vap or interface. That is:

$$P_{AMB}=P_{HP}=f(T_I)$$

For true heat pipe operation, $T_I$ must be equal to $T_{OP}$, the design point operational temperature. It will be noted that the liquid/vapor interface is approximately at the junction of the stem and the enclosure 13 and that the relatively high ambient pressure $P_{AMB}$ is in balance with the internal heat pipe Pressure $P_{HP}$. At the design point the heat pipe operation results in the desired highly uniform temperature of the enclosure 13.

At Stage (E), conditions are illustrated when it is desired to reduce the ambient pressure to one atmosphere. For example, it might be desired to remove a grown crystal from the heat pipe. The ambient pressure surrounding the heat pipe is then reduced at a slow enough rate to permit heat pipe pressure to equilibrate with decreasing interface temperature as working fluid is expelled into the bellows. The expansion of the bellows as the interface recedes down the stem 20 is shown.

The equilibration rate is largely controlled by the size of the opening 19 and the associated internal diameter of the stem 20 and that rate can be quite high for example, the equilibration may take place in less than 0.2 second. If necessary, the diameter of the stem 20 can be increased and the length of the stem decreased to decrease further the equilibration time (although at the penalty of increased extraneous heat losses down the stem). Conditions at Stage (E) are very similar to those existing at Stage (B).

The conditions illustrated as existing at Stage (F) are to be avoided in using the heat pipe of the present invention. They are brought about if the ambient pressure is raised to a high level prematurely, i.e., before the heat pipe is raised to its temperature of operation. That is:

$$P_{AMB} >> P_{HP}$$

In such circumstances, without a temperature gradient along the stem 20, movement of the liquid/vapor interface will not balance $P_{AMB}$ and $P_{HP}$ and the heat pipe will usually collapse because its structure is not capable of withstanding a pressure differential in excess of a few atmospheres. Collapse can be avoided by the inclusion of safety interlocks as well as adequate operator training. Although the destruction of equipment resulting from such collapse is obviously an unwanted occurrence, collapse is a fail-safe alternative inherent in the pressure-balanced design as compared to the explosive potential of prior art designs.

Figure 3:
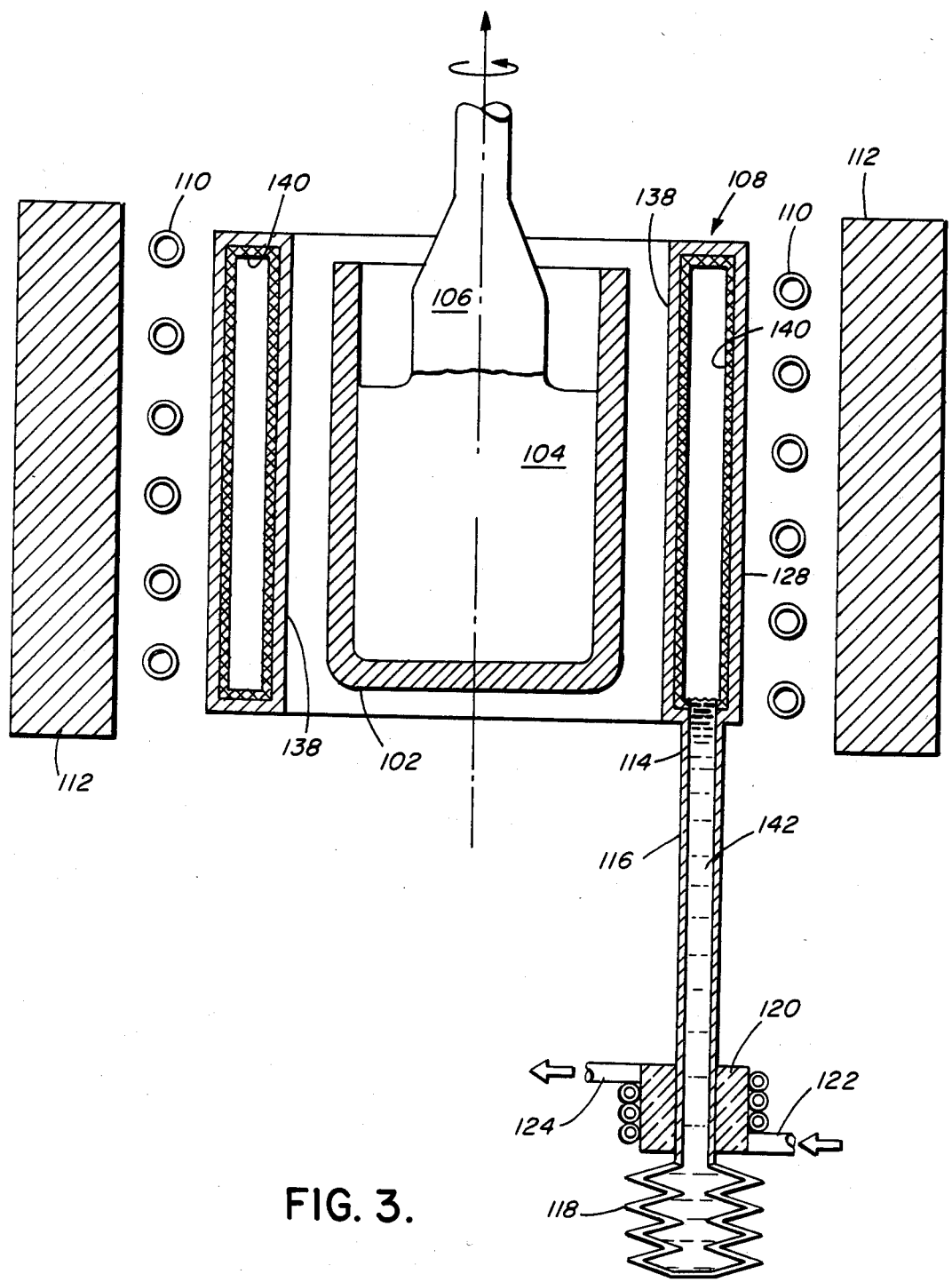
FIG. 3 illustrates in section a pressure balanced heat pipe in a typical operating setting for growing a semiconductor crystal at high temperature and high ambient pressure.

For the specific application of crystal growing, a highly uniform temperature enclosure is desirable, and it may be achieved by shaping the heat pipe as an annulus within which a charge of material may be placed for melting under pressure. In FIG. 3, such an arrangement for crystal growing is shown. It includes a crucible 102 which contains the melt 104 and the crystal 106 being drawn from the melt may be seen as it emerges. Surrounding the crucible 102 is an annular heat pipe 108 which in turn is surrounded by an induction coil heater 110. The induction coil heater 110 is preferably made up of tubing of material such as copper through which a coolant flows. A relatively heavy sleeve of thermal insulation 112 is disposed about the coil 110. The entire assembly may be compartmented or otherwise enclosed to permit control of ambient pressure.

An opening 114 is formed at a point in the bottom annular wall of the heat pipe and a hollow stem 116 is connected to communicate with the interior of the heat pipe through that opening. At the base of the stem, a bellows 118 is connected and a short length of the stem 116 immediately above the bellows is surrounded by a jacket 120 through which a coolant such as water may be circulated through connections 122 and 124.

The heat pipe 108 has an annular outer wall 128 which serves as the heat input element or evaporator receiving heat from the induction coil 110. Uniformly spaced inwardly from the outer wall 128 is an inner wall 138 which serves as the heat output element or condenser portion which provides heat to the crucible 102. Lining the walls of the heat pipe 108 is a wick 140. Working fluid 142 is shown here in its liquid state as filling the bellows 118 and the stem 116 to a point in the heat pipe just above the opening 114. Fluid in the vapor state occupies the remainder of the interior of the heat pipe. Ambient pressure about the heat pipe is maintained at a high level during operation by conventional means, not shown in this view. Working fluid vaporized in the evaporator (outside) portion of the annular pipe by the applied heat flows to and is condensed in the condenser (inside) portion of the heat pipe. After condensation, the fluid returns to the evaporator portion aided by the capillary action of the wick. This arrangement provides a highly uniform crucible and melt temperature by virtue of the uniform and efficient transfer of heat by the heat pipe action. The function of the appended stem and bellows is, of course, as described hereinabove in connection with FIG. 2.

What is claimed is:

1. A pressure-balanced heat pipe comprising a uniform temperature enclosure for transferring heat from an input portion to an output portion thereof, said enclosure shaped as an annulus having an outer wall comprising said input portion and an inner wall comprising said output portion, said inner wall defining a work-heating volume for containing work to be heated by said heat pipe, said enclosure having an opening formed therein, a hollow stem appended to said enclosure and communicating with said enclosure by way of said opening, cooling means disposed about said stem for creating a temperature gradient along a length thereof upon the application of a predetermined amount of heat to said input portion of said enclosure, an expansible chamber connected to said stem, a quantity of working fluid normally disposed as a liquid within said chamber and primarily as a liquid within said stem and primarily as a vapor within said enclosure and a wick disposed within said enclosure for transferring liquid working fluid from said output portion to said input portion, whereby an increase of ambient pressure about said heat pipe after said application of a predetermined amount of heat to the input portion thereof results in a comparable increase of internal pressure within said heat pipe.

2. A pressure-balanced heat pipe as defined in claim 1 wherein said expansible chamber is operable to change in volume to vary the quantity of liquid working fluid therein in direct response to the differential between ambient and heat pipe internal pressure; and said cooling means is disposed about said stem at an area relatively remote from said opening and relatively close to said expansible chamber and is operable to maintain the temperature of said working fluid in said chamber at a point near ambient temperature.

3. A pressure-balanced heat pipe as defined in claim 1 wherein said working fluid has a vapor pressure at least as high as the ambient pressure about said heat pipe during operation.

4. A pressure-balanced heat pipe as in claim 3 wherein said working fluid is selected from the group consisting of lithium, sodium, potassium, and rubidium.

5. A pressure-balanced heat pipe as defined in claim 1 wherein said opening is formed near the base of said annulus and said hollow stem depends from said annulus, working fluid in a liquid state normally filling at least a portion of said hollow stem.

6. A pressure-balanced heat pipe as defined in claim 1 wherein said work comprises a crucible containing materials to be melted.

7. A method of operating a heat pipe at high ambient pressures such as about 1000 psi and at high temperatures such as about 1600 degrees Kelvin without utilizing heat pipe walls capable of supporting large pressure differentials comprising, in the order given, the steps of:
 (a) forming a heat pipe enclosure with an evaporator section, a condenser section, a wick to transport liquid working fluid from the condenser section to the evaporator section, and a hollow stem connected to an opening in the base of the enclosure and having an expansible chamber at its lower end;
 (b) sealing within the heat pipe a selected amount of working fluid having a vapor pressure, at the operating temperature of the heat pipe, at least as high as the ambient operating pressure surrounding the heat pipe;
 (c) applying heat to said heat pipe to raise the temperature of the working fluid to said operating temperature;
 (d) cooling said hollow stem at an area near said expansible chamber to establish a temperature gradient along said hollow stem; and
 (e) increasing the ambient pressure surrounding the heat pipe to said operating pressure thereby causing the volume of said expansible chamber to decrease until the internal pressure of said heat pipe is substantially in balance with said ambient operating pressure.

8. A method as in claim 7 wherein said heat pipe enclosure is formed as an annulus having an outer wall comprising said evaporator, an inner wall forming said condenser, and wherein work to be heated is positioned within the cylindrical zone defined by said inner wall prior to step (c).

9. A method as in claim 8 wherein said work comprises a crucible containing a charge of material for the growing of crystals.

10. A method of operating a heat pipe as defined in claim 7 wherein the amount of working fluid sealed within said heat pipe is such that during operation of said heat pipe an interface is formed between said working fluid in a liquid state and in a vapor state with said interface being located substantially at the junction of said stem and said enclosure.

* * * * *